(12) United States Patent
Hayashi et al.

(10) Patent No.: US 6,379,580 B1
(45) Date of Patent: Apr. 30, 2002

(54) PIEZOELECTRIC CERAMIC MATERIAL AND MONOLITHIC PIEZOELECTRIC TRANSDUCER EMPLOYING THE CERAMIC MATERIAL

(75) Inventors: Koichi Hayashi, Shiga-ken; Akihiro Nakamichi; Akira Ando, both of Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 16 days.

(21) Appl. No.: 09/656,778

(22) Filed: Sep. 7, 2000

(30) Foreign Application Priority Data

Sep. 7, 1999 (JP) .............................. 11-253549

(51) Int. Cl.[7] ...................... C04B 35/472; H01L 47/187
(52) U.S. Cl. ................. 252/62.9 R; 501/134; 310/368
(58) Field of Search .................... 252/62.9 R; 501/134; 310/368

Primary Examiner—C. Melissa Koslow
(74) Attorney, Agent, or Firm—Ostrolenk, Faber, Gerb & Soffen, LLP

(57) ABSTRACT

A piezoelectric ceramic material which can suppress segregation of a W compound or a W oxide in W-containing sintered $PbTiO_3$ and a piezoelectric transducer employing the ceramic material. The ceramic material contains lead titanate as a primary component; an Mn-containing oxide or an Mn-containing compound and a W-containing compound or a W-containing oxide as secondary components; and an Si-containing oxide or an Si-containing compound as an additional component. Alternatively, the piezoelectric ceramic material contains a primary component containing $PbTiO_3$ and $Pb(Mn_yW_{(1-y)})O_3$ and additionally $SiO_2$ or $PbSiO_3$.

20 Claims, 1 Drawing Sheet

PIEZOELECTRIC CERAMIC MATERIAL AND MONOLITHIC PIEZOELECTRIC TRANSDUCER EMPLOYING THE CERAMIC MATERIAL

BACKGROUND OF THE INVENTION

1. Field of the Invention

The present invention relates to a piezoelectric ceramic material, and more particularly, to a piezoelectric ceramic material predominantly containing lead titanate.

2. Background Art

Conventionally, piezoelectric ceramics have been employed in filters used in communication apparatus and also in piezoelectric transducers such as CPU clocks and sensors. Such piezoelectric ceramics predominantly comprise a component such as $PbTiO_3$ or $PbTiO_3$—$PbZrO_3$.

Among these ceramics, piezoelectric ceramics predominantly comprising lead titanate zirconate have a Curie temperature as low as approximately 300° C., although they have a high electromechanical coupling coefficient. Thus, the ceramics cannot be employed at temperatures higher than the above Curie temperature. In addition, the ceramics are not suitably used in piezoelectric transducers which are employed in a high-frequency region due to their having a dielectric constant as high as approximately 1000.

Thus, a piezoelectric ceramic which is used in piezoelectric transducers particularly employed in a high-frequency region comprises lead titanate as a primary component and additives serving as secondary components such as $Bi_2O_3$, $Cr_2O_3$, $MnO_2$ and ZnO, the lead titanate imparting a high Curie temperature and a low dielectric constant to the piezoelectric ceramic.

In addition, Japanese Patent Application Laid-Open (kokai) No. 56–2689 discloses a piezoelectric ceramic composition essentially constituted by a binary-component oxide system represented by $(1-x)PbTiO_3$—$xPb(Me_{1/2}Mn_{1/2})O_3$ (Me: Ta, Nb) in which 1.0–2.0 at. % of Pb is substituted by Sr, and at least one secondary component selected from among $WO_3$, NiO and $Fe_2O_3$ is incorporated in an additional amount of 0.05–2.0 wt. %. The composition successfully attains lowering of sintering temperature, suppression of grain growth, improvement of temperature characteristics and time-elapsing characteristics, and improvement of mechanical quality factor.

However, when $PbTiO_3$ containing W as a secondary component is fired, a W-containing compound or oxide is segregated in the produced sintered $PbTiO_3$. Since such a segregated W compound or W oxide has a significant volume, small-volume chip parts formed from sintered $PbTiO_3$ including the above segregation exhibit variation in electrical characteristics. Furthermore, mechanical strength of the sintered product decreases, thereby increasing failure of chip parts due to cracks and chipping.

SUMMARY OF THE INVENTION

In view of the foregoing, an object of the present invention is to provide a piezoelectric ceramic material which can suppress segregation of a W compound or a W oxide in W-containing sintered $PbTiO_3$. Another object of the invention is to provide a piezoelectric transducer employing the ceramic material.

The present invention has been made so as to attain the aforementioned objects.

Accordingly, the present invention provides a piezoelectric ceramic material which comprises lead titanate as a primary component; an Mn-containing oxide or an Mn-containing compound, and a W-containing compound or a W-containing oxide as secondary components; and an Si-containing oxide or an Si-containing compound as an additional component.

The ceramic material having such a composition provides a piezoelectric ceramic having a high Curie temperature and a low dielectric constant and suppresses segregation of a W-containing oxide or compound in the ceramic. In other words, incorporation of Mn and W into lead titanate successfully lowers firing temperature and suppresses evaporation of Pb, thereby reducing variation in piezoelectric characteristics and attaining high mechanical quality factor (Qmt), while high Curie temperature and low dielectric constant, which are characteristics of lead titanate, are maintained. The present inventors have further found that an Si-containing oxide or compound suppresses segregation of a W-containing compound or oxide. Thus, incorporation of silicon oxide into lead titanate successfully suppresses segregation of a W-containing oxide or compound in piezoelectric ceramics, thereby producing piezoelectric ceramics of excellent reliability and of uniform characteristics.

The present invention also provides a piezoelectric ceramic material which comprises lead titanate as a primary component; an Mn-containing oxide or an Mn-containing compound, and a W-containing compound or a W-containing oxide as secondary components; and an Si-containing oxide or an Si-containing compound as an additional component, wherein about 15 mol % or less (0 mol % excluded) of Pb in the lead titanate is substituted by at least one element selected from among lanthanum, neodymium and cerium.

The ceramic material having such a composition provides a piezoelectric ceramic having a high Curie temperature and a low dielectric constant; lowers sintering temperature; and suppresses evaporation of Pb, thereby reducing variation in piezoelectric characteristics and attaining high mechanical quality factor (Qmt). The ceramic material also suppresses segregation of a W-containing oxide or compound in a produced ceramic. In addition, the temperature characteristics of piezoelectric ceramics can be enhanced as compared with the case of piezoelectric ceramics produced from a non-substituted similar ceramic material.

Preferably, the Mn-containing oxide or compound is incorporated in an amount of about 0.1–5.0 wt. % as reduced to MnO, and the W-containing oxide or compound is incorporated in an amount of about 0.1–5.0 wt. % as reduced to $WO_3$, the weight percentages being on the basis of the primary component. According to this mode, lowering sintering temperature and enhancement of mechanical quality factor can be attained to a greater degree.

Preferably, the Si-containing oxide or compound is added in an amount of about 2.0 wt. % or less (0 wt. % excluded) as reduced to $SiO_2$, with respect to the sum of the above primary component and the above secondary components. According to this mode, segregation of a W-containing oxide or compound can be effectively suppressed without affecting other characteristics, and sintering temperature can be lowered.

The present invention also provides a piezoelectric ceramic material which comprises a primary component containing $PbTiO_3$ and $Pb(Mn_yW_{(1-y)})O_3$ and additionally $SiO_2$ or $PbSiO_3$. The ceramic material having such a composition provides a piezoelectric ceramic having a high Curie temperature and a low dielectric constant, and suppresses segregation of a W-containing oxide or compound in a produced ceramic.

The present invention also provides a piezoelectric ceramic material which comprises a primary component containing $(Pb_{(1-3x/2)}M_x)TiO_3$ and $Pb(Mn_yW_{(1-y)})O_3$ (M represents at least one species selected from among La, Nd, and Ce; $0<x\leq0.1$; and $0<y<1$) and additionally $SiO_2$ or $PbSiO_3$. The ceramic material having such a composition provides a piezoelectric ceramic having a high Curie temperature and a low dielectric constant; lowers sintering temperature; and suppresses evaporation of Pb, thereby reducing variation in piezoelectric characteristics and attaining high mechanical quality factor (Qmt). The ceramic material also suppresses segregation of a W-containing oxide or compound in a produced ceramic. In addition, temperature characteristics of piezoelectric ceramics can be enhanced as compared with the case of piezoelectric ceramics produced from a non-substituted similar ceramic material.

Preferably, in the above piezoelectric ceramic material, the primary component comprises "a" mol of $(Pb_{(1-3x/2)}M_x)TiO_3$ and "(1-a)" mol of $Pb(Mn_yW_{(1-y)})O_3$ ($0.9\leq a\leq0.99$; $\frac{1}{2}\leq y\leq\frac{2}{3}$). According to this mode, lowering sintering temperature and enhancement of mechanical quality factor can be attained to a greater degree.

Preferably, the above piezoelectric ceramic material comprises 100 wt. % of the aforementioned primary component and about 2.0 wt. % or less (0 wt. % excluded) of additional $SiO_2$ or $PbSiO_3$ as reduced to $SiO_2$. According to this mode, segregation of a W-containing oxide or compound can be effectively suppressed without affecting other characteristics, and sintering temperature can be lowered.

The present invention also provides a monolithic piezoelectric transducer which comprises a plate formed of the above-recited piezoelectric ceramic material, a vibration electrode and an external electrode, wherein the vibration electrode is disposed on the piezoelectric ceramic plate to form a laminated body, and the external electrode is electrically connected to the vibration electrode included in the laminated body.

The monolithic piezoelectric transducer has excellent heat resistance and is suitable for employment in a high-frequency region.

BRIEF DESCRIPTION OF THE DRAWING

Various other objects, features, and many of the attendant advantages of the present invention will be readily appreciated as the same becomes better understood with reference to the following detailed description of the preferred embodiments when considered in connection with an accompanying drawing, in which.

DETAILED DESCRIPTION OF PREFERRED EMBODIMENTS

Figure 1:
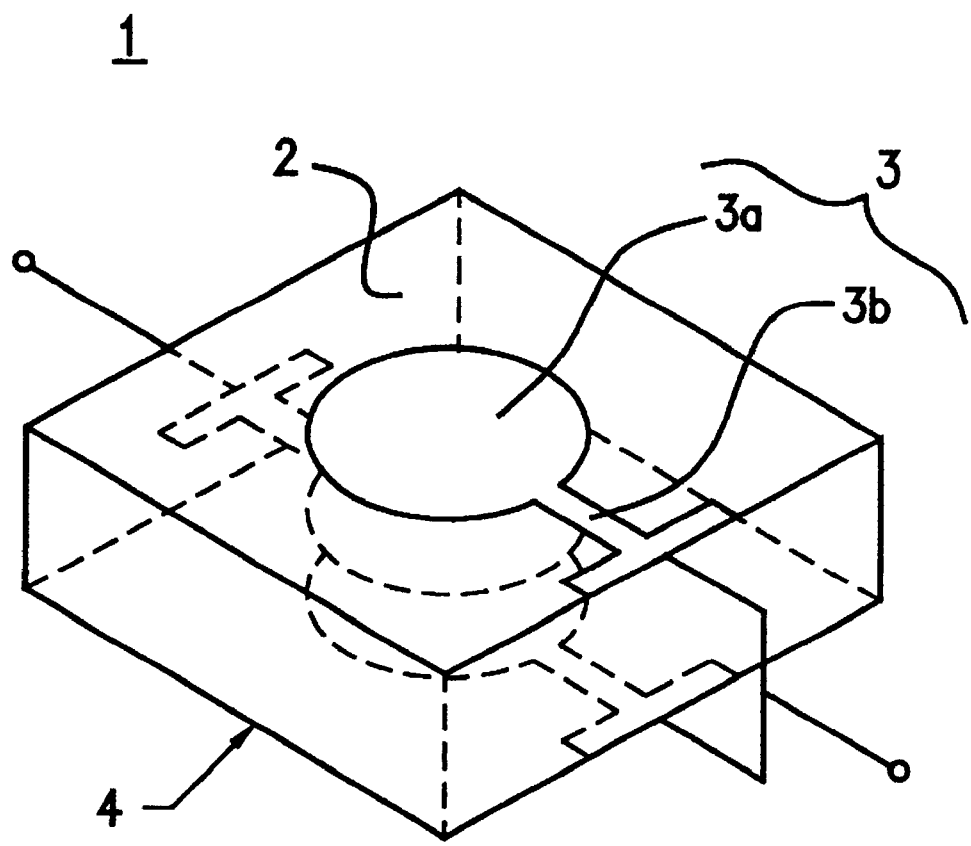
FIG. 1 shows a schematic perspective view of an example of the piezoelectric transducer according to the present invention.

The piezoelectric ceramic material of the present invention comprises lead titanate as a primary component; an Mn-containing oxide or an Mn-containing compound, and a W-containing compound or a W-containing oxide as secondary components; and an Si-containing oxide or an Si-containing compound as an additional component.

In the present invention, lead titanate is not limited to $ABO_3$ (A:B=1:1) type titanates, and slightly non-stoichiometric lead titanates are also included. Pb may be partially substituted with another element. Examples of preferred substituting elements includes La, Nd and Ce. Temperature characteristics of piezoelectric ceramics produced from the Pb-substituted ceramic material can be enhanced as compared with the case of piezoelectric ceramics produced from a non-substituted similar ceramic material. Since La, Nd and Ce are trivalent elements, Pb is substituted in an amount of $\frac{3}{2}$ the total amount by mol of added elements.

The aforementioned Mn-containing oxide or compound is added so as to enhance mechanical quality factor (Qmt) of the produced piezoelectric ceramics, and is not particularly limited so long as it contains Mn. The Mn-containing oxide or compound is preferably added in an amount of about 0.1–5.0 wt. % (as reduced to MnO) with respect to the aforementioned lead titanate.

The aforementioned W-containing oxide or compound is added so as to lower sintering temperature of the piezoelectric ceramic material, and is not particularly limited so long as it contains W. The W-containing oxide or compound is preferably added in an amount of about 0.1–5.0 wt. % (as reduced to $WO_3$) with respect to the aforementioned lead titanate.

The range of mol ratio y, which is defined in the formula $Pb(Mn_yW_{(1-y)})O_3$, is preferably $\frac{1}{2}\leq y\leq\frac{2}{3}$.

The aforementioned Si-containing oxide or compound is added so as to suppress segregation of a W-containing oxide or compound in the produced piezoelectric ceramic and lower the sintering temperature of the piezoelectric ceramic material. Examples of Si-containing oxides or compounds include $SiO_2$ and $PbSiO_3$. The Si-containing oxide or compound is preferably added in an amount of about 2.0 wt. % or less (0 wt. % excluded) as reduced to $SiO_2$, more preferably about 0.05–1.0 wt. %, with respect to the entirety of the aforementioned lead titanate, Mn-containing oxide or compound, and the W-containing oxide or compound. The Si-containing oxide or compound may be added during mixing of starting materials or during blending a binder with a calcined product.

No particular limitation is imposed on the shape of the monolithic piezoelectric transducer, so long as the transducer comprises a plate formed of the piezoelectric ceramic material of the present invention, the vibration electrode is disposed on the piezoelectric ceramic plate to form a laminated body, and the external electrode is electrically connected to the vibration electrode. For example, FIG. 1 shows an energy-trapping piezoelectric transducer 1. The piezoelectric transducer 1 comprises a piezoelectric ceramic plate 2, a vibration electrode 3 formed on a main surface of the piezoelectric ceramic plate 2, and an external electrode (not shown) which is electrically connected with the vibration electrode 3. Among these components, the vibration electrode 3 comprises a vibration portion 3a which is disposed in a central portion of the piezoelectric ceramic plate, and a lead portion 3b which electrically connects the vibration portion 3a and the external electrode. A plurality of the thus-formed units are layered, to thereby form a laminated body 4, and external electrodes are formed on a vibration electrode-exposed surface, thereby forming the piezoelectric transducer 1.

The piezoelectric ceramic material of the present invention will next be described in detail by way of examples.

EXAMPLES

Example 1

PbO, $TiO_2$, MnO and $WO_3$ serving as starting materials were weighed and blended so as to prepare mixtures having a composition represented by $PbTiO_3$+p wt. % of MnO +q wt. % of $WO_3$. Each mixture was wet-mixed for 16 hours by means of a ball mill employing grinding balls of stabilized zirconia, dehydrated, and calcined at 850° C. for two hours. The calcined powder product was blended with a poly(vinyl alcohol) binder and a predetermined amount of $SiO_2$ or $PbSiO_3$, to thereby form a binder mixture, which was pressed at 1 tons/cm$^2$ to form a disk. The thus-obtained disk was fired at 1000–1250° C. for two hours, thereby forming a sintered disk. A silver electrode was vapor-deposited on each main surface of the disk. The electrode-equipped disk was immersed in insulating oil at 60–150° C. and subjected to polarization treatment by application of a DC voltage of 2.0–8.0 kV/mm, to thereby prepare a sample. A comparative sample was prepared in a similar manner except that $PbTiO_3$—$PbZrO_3$ was used instead of $PbTiO_3$.

The above-prepared samples and the comparative sample were evaluated in terms of density of sintered product, segregation of W, specific dielectric constant, Curie temperature and piezoelectric characteristics. The piezoelectric characteristics include electromechanical coupling constant (kt) and mechanical quality factor (Qmt) to perpendicular vibration generated in a thickness direction of the disk samples. These properties are evaluated by means of an impedance analyzer. Resonance frequency was measured in the temperature range of −20° C. to 80° C. to thereby obtain temperature coefficient of resonance frequency (/degree) (Fr–TC). The results are shown in Table 1. In all cases, the amount of added $PbSiO_3$ was calculated as $SiO_2$. In Table 1, samples marked with * fall outside the scope of the invention.

TABLE 1

| Sample No. | Primary component | Secondary components (wt. %) | | | Firing temperature (° C.) | Density of sintered product (g/cm$^3$) | W segregation | Specific dielectric constant | Curie temperature (° C.) | kt (%) | Qmt | Fr-TC (ppm/° C.) |
|---|---|---|---|---|---|---|---|---|---|---|---|---|
| | | MnO | WO$_3$ | SiO$_2$ | | | | | | | | |
| *1-1 | PT | 2.00 | 2.00 | 0.00 | 1100 | 6.85 | Yes | 360 | Not polarized due to insufficient sinterability | | | |
| 1-2 | PT | 2.00 | 2.00 | 0.05 | 1100 | 7.65 | No | 320 | 340 | 34.0 | 1020 | −51 |
| 1-3 | PT | 2.00 | 2.00 | 0.10 | 1100 | 7.64 | No | 320 | 330 | 33.1 | 1040 | −55 |
| 1-4 | PT | 2.00 | 2.00 | 0.50 | 1100 | 7.65 | No | 320 | 330 | 32.6 | 980 | −46 |
| 1-5 | PT | 2.00 | 2.00 | 1.00 | 1100 | 7.61 | No | 330 | 330 | 32.5 | 1030 | −48 |
| 1-6 | PT | 2.00 | 2.00 | 2.00 | 1100 | 7.59 | No | 350 | 330 | 31.2 | 970 | −46 |
| 1-7 | PT | 2.00 | 2.00 | 3.00 | 1100 | 7.60 | No | 380 | 330 | 15.9 | 542 | −50 |
| *1-8 | PT | 0.00 | 2.00 | 0.50 | 1100 | 7.58 | No | 320 | 340 | 22.5 | 360 | −51 |
| 1-9 | PT | 0.08 | 2.00 | 0.50 | 1100 | 7.62 | No | 320 | 340 | 33.2 | 1030 | −47 |
| 1-10 | PT | 0.10 | 2.00 | 0.50 | 1100 | 7.61 | No | 320 | 340 | 33.5 | 1050 | −49 |
| 1-11 | PT | 0.50 | 2.00 | 0.50 | 1100 | 7.62 | No | 330 | 330 | 32.8 | 1020 | −49 |
| 1-12 | PT | 1.00 | 2.00 | 0.50 | 1100 | 7.63 | No | 330 | 330 | 32.4 | 1020 | −53 |
| 1-13 | PT | 3.00 | 2.00 | 0.50 | 1100 | 7.64 | No | 330 | 330 | 33.0 | 1050 | −50 |
| 1-14 | PT | 5.00 | 2.00 | 0.50 | 1100 | 7.62 | No | 340 | 330 | 33.1 | 990 | −51 |
| 1-15 | PT | 6.00 | 2.00 | 0.50 | 1100 | 7.61 | No | 340 | 330 | 32.2 | 980 | −48 |
| *1-16 | PT | 2.00 | 0.00 | 0.50 | 1150 | 6.81 | No | 360 | Not polarized due to insufficient sinterability | | | |
| 1-17 | PT | 2.00 | 0.08 | 0.50 | 1150 | 7.60 | No | 330 | 330 | 33.8 | 1040 | −53 |
| 1-18 | PT | 2.00 | 0.10 | 0.50 | 1100 | 7.61 | No | 330 | 330 | 33.1 | 1020 | −54 |
| 1-19 | PT | 2.00 | 0.50 | 0.50 | 1100 | 7.64 | No | 330 | 330 | 33.0 | 1000 | −48 |
| 1-20 | PT | 2.00 | 1.00 | 0.50 | 1100 | 7.63 | No | 330 | 330 | 33.2 | 1000 | −52 |
| 1-21 | PT | 2.00 | 3.00 | 0.50 | 1100 | 7.66 | No | 330 | 330 | 32.8 | 1030 | −49 |
| 1-22 | PT | 2.00 | 5.00 | 0.50 | 1100 | 7.62 | No | 330 | 330 | 33.4 | 980 | −53 |
| 1-23 | PT | 2.00 | 6.00 | 0.50 | 1100 | 7.64 | No | 330 | 230 | 32.2 | 980 | −53 |
| Comparative sample | PZT | 2.00 | 2.00 | 0.50 | 1100 | 7.66 | No | 1050 | 300 | 35.0 | 750 | −51 |

As is clear from Table 1, segregation of W is not observed in $PbTiO_3$ piezoelectric ceramics containing MnO, $WO_3$, and $SiO_2$ or $PbSiO_3$. In addition, these ceramics show low specific dielectric constant, high Curie temperature, high electromechanical coupling constant (kt) and high mechanical quality factor (Qmt).

Example 2

The procedure of Example 1 was repeated, except that PbO, $TiO_2$, $La_2O_3$, $Nd_2O_3$, $Ce_2O_3$, MnO and $WO_3$ serving as staring materials were weighed and blended so as to prepare mixtures having a composition represented by $(Pb_{1-3x/2}(La, Nd, Ce)_x)TiO_3 + p$ wt. % of MnO + q wt. % of $WO_3$, to thereby prepare samples.

In a manner similar to that of Example 1, the above-prepared samples were evaluated in terms of density of sintered product, segregation of W, specific dielectric constant, Curie temperature, and piezoelectric characteristics. The results are shown in Table 2.

addition of MnO in an amount more than about 5.0 wt. % exhibits low insulation resistance and can be polarized only through a particular method and polarization treatment is disadvantageously insufficient.

In a preferred mode of the invention, the W-containing oxide or compound is added in an amount of about 0.1–5.0 wt. % (as reduced to $WO_3$) with respect to the primary component. When $WO_3$ is added in an amount less than

TABLE 2

| Sample No. | Substituting elements (mol %) | | | Secondary components (wt. %) | | | Firing temperature (° C.) | Density of sintered product (g/cm³) | W segregation | Specific dielectric constant | Curie temperature (° C.) | kt (%) | Qmt | Fr-TC (ppm/° C.) |
|---|---|---|---|---|---|---|---|---|---|---|---|---|---|---|
| | La | Nd | Ce | MnO | $WO_3$ | $SiO_2$ | | | | | | | | |
| *2-1 | 0.0 | 0.0 | 0.0 | 2.00 | 2.00 | 0.50 | 1100 | 7.65 | No | 330 | 340 | 34.0 | 1010 | −51 |
| 2-2 | 1.0 | 0.0 | 0.0 | 2.00 | 2.00 | 0.50 | 1100 | 7.61 | No | 330 | 330 | 33.3 | 1030 | −42 |
| 2-3 | 0.0 | 1.0 | 0.0 | 2.00 | 2.00 | 0.50 | 1100 | 7.62 | No | 330 | 330 | 33.5 | 1000 | −31 |
| 2-4 | 0.0 | 0.0 | 1.0 | 2.00 | 2.00 | 0.50 | 1100 | 7.65 | No | 320 | 330 | 32.9 | 1040 | −29 |
| 2-5 | 1.0 | 1.0 | 0.0 | 2.00 | 2.00 | 0.50 | 1100 | 7.60 | No | 330 | 320 | 33.1 | 1050 | −32 |
| 2-6 | 1.0 | 0.0 | 1.0 | 2.00 | 2.00 | 0.50 | 1100 | 7.59 | No | 330 | 320 | 33.2 | 1020 | −30 |
| 2-7 | 0.0 | 1.0 | 1.0 | 2.00 | 2.00 | 0.50 | 1100 | 7.63 | No | 330 | 320 | 33.4 | 1000 | −26 |
| 2-8 | 1.0 | 1.0 | 1.0 | 2.00 | 2.00 | 0.50 | 1100 | 7.60 | No | 330 | 310 | 33.1 | 1030 | −25 |
| 2-9 | 0.0 | 5.0 | 0.0 | 2.00 | 2.00 | 0.50 | 1100 | 7.57 | No | 340 | 310 | 33.0 | 1010 | −20 |
| 2-10 | 10.0 | 0.0 | 0.0 | 2.00 | 2.00 | 0.50 | 1100 | 7.59 | No | 340 | 300 | 33.0 | 970 | −31 |
| 2-11 | 0.0 | 10.0 | 0.0 | 2.00 | 2.00 | 0.50 | 1100 | 7.62 | No | 340 | 300 | 32.7 | 990 | −13 |
| 2-12 | 0.0 | 0.0 | 10.0 | 2.00 | 2.00 | 0.50 | 1100 | 7.60 | No | 340 | 300 | 32.5 | 1000 | −11 |
| 2-13 | 5.0 | 2.5 | 2.5 | 2.00 | 2.00 | 0.50 | 1100 | 7.63 | No | 340 | 300 | 32.1 | 980 | −18 |
| *2-14 | 11.0 | 0.0 | 0.0 | 2.00 | 2.00 | 0.50 | 1100 | 7.58 | No | 340 | 240 | 32.1 | 980 | −25 |
| *2-15 | 0.0 | 11.0 | 0.0 | 2.00 | 2.00 | 0.50 | 1100 | 7.57 | No | 340 | 230 | 32.2 | 960 | −11 |
| *2-16 | 0.0 | 0.0 | 11.0 | 2.00 | 2.00 | 0.50 | 1100 | 7.60 | No | 340 | 230 | 31.9 | 990 | −9 |

As is clear from Table 2, segregation of W is not observed in $PbTiO_3$ piezoelectric ceramics containing MnO, $WO_3$, and $SiO_2$ or $PbSiO_3$. In addition, these ceramics show low specific dielectric constant, high Curie temperature, high electromechanical coupling constant (kt) and high mechanical quality factor (Qmt). Lead titanate piezoelectric ceramics in which Pb is substituted by at least one metal selected from La, Nd and Ce in an amount of about 15 mol % or less exhibit excellent temperature characteristics as compared with non-substituted lead titanate piezoelectric ceramics.

The reasons why the amount of each component is limited in the aforementioned modes will be described based on the results of Examples 1 and 2.

Sample Nos. 2-14, 2-15, and 2-16 in Table 2 contain La, Nd and Ce in a total amount of 11.0 mol %, i.e., substitution of Pb in excess of 15 mol %, exhibit disadvantageously low Curie temperature. Therefore, the substitution of Pb is limited to about 15 mol % or less.

In a preferred mode of the invention, the Mn-containing oxide or compound is added in an amount of about 0.1–5.0 wt. % (as reduced to MnO) with respect to the primary component. This is because when MnO is added in an amount less than about 0.1 wt. % as in the case of Sample No. 1–9, the mechanical quality factor (Qmt) is disadvantageously low and the effect of Mn on improvement of Qmt is not attained, whereas as proven by Sample No. 1–15, about 0.1 wt. % as in the case of Sample No. 1–7, the sintering temperature insufficiently decreases, and such ceramic material must be fired disadvantageously at 1150° C. or higher, preferably 1250° C. or higher, whereas as in the case of Sample No. 1–23, when $WO_3$ is contained in an amount more than about 5.0 wt. %, a disadvantageously low Curie temperature results.

In a preferred mode of the invention, the Si-containing oxide or compound is added in an amount of about 2.0 wt. % or less as reduced to $SiO_2$ to 100 wt. % of the sum of the above primary component and the above secondary components. When $SiO_2$ is added in an amount more than about 2.0 wt. % as in the case of Sample No. 1–7, the electromechanical coupling constant is disadvantageously lowered.

Example 3

The procedure of Example 1 was repeated, except that PbO, $TiO_2$, MnO, and $WO_3$ serving as staring materials were weighed and blended so as to prepare mixtures having a composition represented by $aPbTiO_3 + (1-a)Pb(Mn_yW_{(1-y)})O_3$ to thereby prepare samples.

In a manner similar to that of Example 1, the above-prepared samples were evaluated for density of sintered product, segregation of W, specific dielectric constant, Curie temperature, and piezoelectric characteristics. The results are shown in Table 3.

TABLE 3

| Sample No. | Primary Component a | Primary Component y | Additional component (wt. %) SiO$_2$ | Firing temperature (° C.) | Density of sintered product (g/cm$^3$) | W segregation | Specific dielectric constant | Curie temperature (° C.) | kt (%) | Qmt | Fr-TC (ppm/° C.) |
|---|---|---|---|---|---|---|---|---|---|---|---|
| 3-1 | 0.890 | 0.55 | 0.50 | 1100 | 7.61 | No | 330 | 340 | 33.1 | 1050 | −52 |
| 3-2 | 0.900 | 0.55 | 0.50 | 1100 | 7.59 | No | 330 | 340 | 32.5 | 1030 | −50 |
| 3-3 | 0.950 | 0.55 | 0.50 | 1100 | 7.62 | No | 340 | 340 | 33.3 | 1010 | −53 |
| 3-4 | 0.990 | 0.55 | 0.50 | 1100 | 7.63 | No | 340 | 340 | 32.6 | 1040 | −49 |
| 3-5 | 0.995 | 0.55 | 0.50 | 1150 | 7.59 | No | 340 | 340 | 32.4 | 1000 | −50 |
| 3-6 | 0.950 | 0.40 | 0.50 | 1150 | 7.62 | No | 330 | 340 | 33.9 | 1010 | −48 |
| 3-7 | 0.950 | 0.60 | 0.50 | 1050 | 7.63 | No | 340 | 340 | 33.4 | 990 | −47 |
| 3-8 | 0.950 | 0.66 | 0.50 | 1050 | 7.65 | No | 330 | 340 | 33.8 | 1030 | −50 |
| 3-9 | 0.950 | 0.70 | 0.50 | 1150 | 7.60 | No | 320 | 340 | 33.5 | 1040 | −53 |
| *3-10 | 0.970 | 0.55 | 0.00 | 1100 | 6.82 | Yes | 370 | Not polarized due to insufficient sinterability | | | |
| 3-11 | 0.970 | 0.55 | 0.05 | 1100 | 7.52 | No | 320 | 330 | 33.6 | 980 | −51 |
| 3-12 | 0.970 | 0.55 | 0.10 | 1100 | 7.57 | No | 320 | 330 | 32.9 | 970 | −46 |
| 3-13 | 0.970 | 0.55 | 0.50 | 1100 | 7.61 | No | 320 | 330 | 33.0 | 1030 | −52 |
| 3-14 | 0.970 | 0.55 | 1.00 | 1100 | 7.60 | No | 340 | 330 | 32.1 | 1000 | −50 |
| 3-15 | 0.970 | 0.55 | 2.00 | 1100 | 7.58 | No | 350 | 330 | 31.8 | 1040 | −47 |
| 3-16 | 0.970 | 0.55 | 3.00 | 1100 | 7.61 | No | 370 | 330 | 16.2 | 557 | −45 |

As is clear from Table 3, segregation of W is not observed in PbTiO$_3$—Pb(Mn, W)O$_3$ binary piezoelectric ceramics containing SiO$_2$ or PbSiO$_3$. In addition, these ceramics show low specific dielectric constant, high Curie temperature, high electromechanical coupling constant (kt), and high mechanical quality factor (Qmt).

Example 4

The procedure of Example 1 was repeated, except that PbO, TiO$_2$, MnO and WO$_3$ serving as staring materials were weighed and blended so as to prepare mixtures having a composition represented by a (Pb$_{1-3x/2}$(La, Nd, Ce)$_x$)TiO$_3$+ (1−a)Pb(Mn$_y$W$_{(1-y)}$)O$_3$ to thereby prepare samples.

In a manner similar to that of Example 1, the above-prepared samples were evaluated in terms of density of sintered product, segregation of W, specific dielectric constant, Curie temperature and piezoelectric characteristics. The results are shown in Table 4.

and high mechanical quality factor (Qmt). Lead titanate piezoelectric ceramics in which Pb is partially substituted by at least one metal selected from among La, Nd and Ce exhibit excellent temperature characteristics of resonance frequency as compared with non-substituted lead titanate piezoelectric ceramics.

The reasons why the amount of each component is limited in the aforementioned modes will be described based on the results of Examples 3 and 4.

As shown in Table 4, Sample Nos. 4-11, 4-12, and 4-13 in which at least one of La, Nd and Ce is substituted in an amount more than about 0.1 mol based on 1 mol of Pb exhibit low Curie temperature. Therefore, the substitution amount of at least one of La, Nd and Ce based on 1 mol of Pb, represented by x, is limited to fall the range 0<x≦0.1.

In a preferred mode of the invention, the range of "a" is limited to fall the range 0.9≦a≦0.99, wherein "a" represent the amount of PbTiO$_3$ or (Pb$_{(1-3x/2)}$M$_x$)TiO$_3$ and "(1−a)" represents the amount of Pb(Mn$_y$W$_{(1-y)}$)O$_3$. Sample No. 3-1,

TABLE 4

| Sample No. | Substituting elements (mol %) La | Substituting elements (mol %) Nd | Substituting elements (mol %) Ce | Primary Component a | Primary Component y | Additional component (wt. %) SiO$_2$ | Firing temperature (° C.) | Density of sintered product (g/cm$^3$) | W segregation | Specific dielectric constant | Curie temperature (° C.) | kt (%) | Qmt | Fr-TC (ppm/° C.) |
|---|---|---|---|---|---|---|---|---|---|---|---|---|---|---|
| *4-1 | 0.0 | 0.0 | 0.0 | 0.970 | 0.55 | 0.50 | 1100 | 7.61 | No | 320 | 340 | 33.0 | 1030 | −52 |
| 4-2 | 1.0 | 0.0 | 0.0 | 0.970 | 0.55 | 0.50 | 1100 | 7.60 | No | 320 | 330 | 32.5 | 1010 | −42 |
| 4-3 | 0.0 | 1.0 | 0.0 | 0.970 | 0.55 | 0.50 | 1100 | 7.65 | No | 330 | 330 | 33.1 | 1040 | −30 |
| 4-4 | 0.0 | 0.0 | 1.0 | 0.970 | 0.55 | 0.50 | 1100 | 7.59 | No | 330 | 330 | 32.2 | 1020 | −31 |
| 4-5 | 1.0 | 1.0 | 1.0 | 0.970 | 0.55 | 0.50 | 1100 | 7.60 | No | 330 | 320 | 32.3 | 980 | −24 |
| 4-6 | 0.0 | 5.0 | 0.0 | 0.970 | 0.55 | 0.50 | 1100 | 7.62 | No | 330 | 310 | 33.6 | 1010 | −19 |
| 4-7 | 10.0 | 0.0 | 0.0 | 0.970 | 0.55 | 0.50 | 1100 | 7.61 | No | 340 | 300 | 33.8 | 990 | −32 |
| 4-8 | 0.0 | 10.0 | 0.0 | 0.970 | 0.55 | 0.50 | 1100 | 7.57 | No | 340 | 300 | 32.9 | 1030 | −14 |
| 4-9 | 0.0 | 0.0 | 10.0 | 0.970 | 0.55 | 0.50 | 1100 | 7.60 | No | 340 | 300 | 32.7 | 1000 | −10 |
| 4-10 | 5.0 | 2.5 | 2.5 | 0.970 | 0.55 | 0.50 | 1100 | 7.57 | No | 340 | 300 | 32.2 | 970 | −19 |
| *4-11 | 11.0 | 0.0 | 0.0 | 0.970 | 0.55 | 0.50 | 1100 | 7.57 | No | 340 | 230 | 31.8 | 960 | −24 |
| *4-12 | 0.0 | 11.0 | 0.0 | 0.970 | 0.55 | 0.50 | 1100 | 7.60 | No | 340 | 230 | 32.2 | 990 | −12 |
| *4-13 | 0.0 | 0.0 | 11.0 | 0.970 | 0.55 | 0.50 | 1100 | 7.56 | No | 340 | 220 | 32.5 | 990 | −11 |

As is clear from Table 4, segregation of W is not observed in (Pb(La, Nd, Ce))TiO$_3$—Pb(Mn, W)O$_3$ binary piezoelectric ceramics containing SiO$_2$ or PbSiO$_3$. In addition, these ceramics show low specific dielectric constant, high Curie temperature, high electromechanical coupling constant (kt)

in which "a" is less than 0.9, exhibits low insulation resistance and Curie temperature and can be polarized only through a particular method. Thus, polarization treatment is insufficient. In contrast, when "a" is in excess of 0.99, sintering at low temperature is difficult, and such ceramic material must be fired at 1150° C. or higher, preferably 1250° C. or higher.

In a preferred mode of the invention, the range of "y" is limited to $\frac{1}{2} \leq y \leq \frac{2}{3}$, wherein "y" represents the amount of Mn and "(1—y)" represents the amount of W. When y falls outside of the above range as in the case of Sample Nos. 3-6 and 3-9, sintering at low temperature is difficult, and such ceramic material must be fired at 1150° C. or higher, preferably 1250° C. or higher.

In a preferred mode of the invention, $SiO_2$ or $PbSiO_3$ is added in an amount of about 2.0 wt. % or less as reduced to $SiO_2$ with respect to 100 wt. % of the above primary component. This is because, as in the case of Sample No. 3-16, when $SiO_2$ is added in an amount more than about 2.0 wt. %, electromechanical coupling constant is disadvantageously low.

As described hereinabove, the piezoelectric ceramic material of the present invention comprises lead titanate as a primary component; an Mn-containing oxide or an Mn-containing compound and a W-containing compound or a W-containing oxide as secondary components; and an Si-containing oxide or an Si-containing compound as an additional component. With this constitution, the ceramic material provides a piezoelectric ceramic having a high Curie temperature and a low dielectric constant and suppresses segregation of a W-containing oxide or compound in the produced ceramic.

The present invention also provides a piezoelectric ceramic material which comprises lead titanate as a primary component; an Mn-containing oxide or an Mn-containing compound and a W-containing compound or a W-containing oxide as secondary components; and an Si-containing oxide or an Si-containing compound as an additional component, wherein about 15 mol % or less (0 mol % excluded) of Pb in the lead titanate are substituted by at least one of lanthanum, neodymium and cerium. The ceramic material provides a piezoelectric ceramic having a high Curie temperature and a low dielectric constant; lowers sintering temperature; and suppresses evaporation of Pb, thereby reducing variation in piezoelectric characteristics and attaining high mechanical quality factor (Qmt). The ceramic material also suppresses segregation of a W-containing oxide or compound in the produced ceramic. In addition, temperature characteristics of piezoelectric ceramics can be enhanced as compared to piezoelectric ceramics produced from a non-substituted similar ceramic material.

In the piezoelectric ceramic material of the present invention, preferably, the Mn-containing oxide or compound is incorporated in an amount of about 0.1–5.0 wt. % as reduced to MnO and the W-containing oxide or compound is incorporated in an amount of about 0.1–5.0 wt. % as reduced to $WO_3$ into the above primary component. Thus, sintering temperature is lowered and mechanical quality factor can be enhanced more considerably.

In the piezoelectric ceramic material of the present invention, preferably, the Si-containing oxide or compound is added in an amount of about 2.0 wt. % or less (0 wt. % excluded) as reduced to $SiO_2$ to 100 wt. % of the sum of the above primary component and the above secondary components. Thus, segregation of a W-containing oxide or compound can effectively be suppressed without affecting other characteristics, and sintering temperature can be lowered.

The present invention also provides a piezoelectric ceramic material which comprises a primary component containing $PbTiO_3$ and $Pb(Mn_yW_{(1-y)})O_3$ and an additional component of $SiO_2$ or $PbSiO_3$. Thus, the ceramic material yields a piezoelectric ceramic having a high Curie temperature and a low dielectric constant, and suppresses segregation of a W-containing oxide or compound in the produced ceramic.

The present invention also provides a piezoelectric ceramic material which comprises a primary component containing $(Pb_{(1-3x/2)}M_x)TiO_3$ and $Pb(Mn_yW_{(1-y)})O_3$ (M represents at least one species selected from among La, Nd and Ce; $0<x\leq0.1$; and $0<y<1$) and additionally $SiO_2$ or $PbSiO_3$. The ceramic material having such a composition provides a piezoelectric ceramic having a high Curie temperature and a low dielectric constant; lowers sintering temperature; and suppresses evaporation of Pb, thereby reducing variation in piezoelectric characteristics and attaining high mechanical quality factor (Qmt). The ceramic material also suppresses segregation of a W-containing oxide or compound in the produced ceramic. In addition, temperature characteristics of piezoelectric ceramics can be enhanced as compared to piezoelectric ceramics produced from a non-substituted similar ceramic material.

In the piezoelectric ceramic material of the present invention, preferably, the amount by mol of $(Pb_{(1-3x/2)}M_x)TiO_3$, represented by "a," and the amount by mol of $Pb(Mn_yW_{(1-y)})O_3$, represented by "(1-a)" has the relationship: $0.9 \leq a \leq 0.99$; $\frac{1}{2} \leq y \leq \frac{2}{3}$. Thus, sintering temperature is lowered and mechanical quality factor can be enhanced more considerably.

The piezoelectric ceramic material of the present invention preferably comprises 100 wt. % of the aforementioned primary component and about 2.0 wt. % or less (0 wt. % excluded) of additional $SiO_2$ or $PbSiO_3$ as reduced to $SiO_2$. Thus, segregation of a W-containing oxide or compound can effectively be suppressed without affecting other characteristics, and sintering temperature can be lowered.

The present invention also provides a monolithic piezoelectric transducer which comprises a laminated body including a plate-shaped piezoelectric ceramic prepared from the piezoelectric ceramic material of the present invention, vibration electrodes disposed on both primary surfaces of the piezoelectric ceramic, and lead electrodes each being connected to one of the vibration electrodes and formed to extend to a side face of the piezoelectric ceramic; and external electrodes provided on the side faces containing the lead electrodes. Thus, the monolithic piezoelectric transducer has excellent heat resistance and suitable for employing in a high-frequency region.

What is claimed is:

1. A piezoelectric ceramic material which comprises lead titanate as primary component; an Mn-containing compound and a W-containing compound as secondary components; and an Si-containing compound as an additional component.

2. A piezoelectric ceramic material according to claim 1, wherein more than 0% up to about 15 mol % of the non-titanate portion of the lead titanate comprises at least one of lanthanum, neodymium or cerium.

3. A piezoelectric ceramic material according to claim 2, wherein the Mn-containing compound is in an amount of about 0.1–5.0 wt. % as reduced to MnO, and the W-containing compound is in an amount of about 0.1–5.0 wt. % as reduced to $WO_3$, the weight percentages being on the basis of the primary component.

4. A piezoelectric ceramic material according to claim 3, wherein the Si-containing compound is in an amount of about 2.0 wt. % or less (0 wt. % excluded) as reduced to $SiO_2$, with respect to the sum of the primary component and the secondary components.

5. A piezoelectric ceramic material according to claim 4, wherein the Mn-containing compound, the W-containing compound and the Si-containing compound are oxides.

6. A piezoelectric ceramic material according to claim 2, comprising $(Pb_{(1-3x/2)}M_x)TiO_3$, $Pb(Mn_yW_{(1-y)})O_3$ in which M represents at least one of La, Nd and Ce, $0<x\leq0.1$ and $0<y<1$, and $SiO_2$ or $PbSiO_3$.

7. The piezoelectric ceramic material according to claim 6, containing "a" mol of $(Pb_{(1-3x/2)}M_x)TiO_3$ and "(1-a)" mol of $Pb(Mn_yW_{(1-y)})O_3$, wherein $0.9\leq a\leq 0.99$ and $½\leq y\leq ⅔$.

8. A piezoelectric ceramic material according to claim 1, comprising $PbTiO_3$, $Pb(Mn_yW_{(1-y)})O_3$ in which $0<y<1$ and wherein the Si-containing compound comprises $SiO_2$ or $PbSiO_3$.

9. A piezoelectric ceramic material according to claim 1, wherein the Mn-containing compound is in an amount of about 0.1–5.0 wt. % as reduced to MnO, and the W-containing compound is in an amount of about 0.1–5.0 wt. % as reduced to $WO_3$, the weight percentages being on the basis of the primary component.

10. A piezoelectric ceramic material according to claim 9, wherein the Si-containing compound is in an amount of about 2.0 wt. % or less (0 wt. % excluded) as reduced to $SiO_2$, with respect to the sum of the primary component and the secondary components.

11. A piezoelectric ceramic material according to claim 1, wherein the Si-containing compound is in an amount of about 2.0 wt. % or less (0 wt. % excluded) as reduced to $SiO_2$, with respect to the sum of the primary component and the secondary components.

12. A monolithic piezoelectric transducer which comprises a laminated body including a plate-shaped piezoelectric ceramic comprising the piezoelectric ceramic material according to claim 11 and a vibration electrode disposed on the piezoelectric ceramic; and an external electrodes electrically connected to the vibration electrode in the laminated body.

13. A monolithic piezoelectric transducer which comprises a laminated body including a plate-shaped piezoelectric ceramic comprising the piezoelectric ceramic material according to claim 9 and a vibration electrode disposed on the piezoelectric ceramic; and an external electrodes electrically connected to the vibration electrode in the laminated body.

14. A monolithic piezoelectric transducer which comprises a laminated body including a plate-shaped piezoelectric ceramic comprising the piezoelectric ceramic material according to claim 8 and a vibration electrode disposed on the piezoelectric ceramic; and an external electrodes electrically connected to the vibration electrode in the laminated body.

15. A monolithic piezoelectric transducer which comprises a laminated body including a plate-shaped piezoelectric ceramic comprising the piezoelectric ceramic material according to claim 7 and a vibration electrode disposed on the piezoelectric ceramic; and an external electrodes electrically connected to the vibration electrode in the laminated body.

16. A monolithic piezoelectric transducer which comprises a laminated body including a plate-shaped piezoelectric ceramic comprising the piezoelectric ceramic material according to claim 6 and a vibration electrode disposed on the piezoelectric ceramic; and an external electrodes electrically connected to the vibration electrode in the laminated body.

17. A monolithic piezoelectric transducer which comprises a laminated body including a plate-shaped piezoelectric ceramic comprising the piezoelectric ceramic material according to claim 4 and a vibration electrode disposed on the piezoelectric ceramic; and an external electrodes electrically connected to the vibration electrode in the laminated body.

18. A monolithic piezoelectric transducer which comprises a laminated body including a plate-shaped piezoelectric ceramic comprising the piezoelectric ceramic material according to claim 3 and a vibration electrode disposed on the piezoelectric ceramic; and an external electrodes electrically connected to the vibration electrode in the laminated body.

19. A monolithic piezoelectric transducer which comprises a laminated body including a plate-shaped piezoelectric ceramic comprising the piezoelectric ceramic material according to claim 2 and a vibration electrode disposed on the piezoelectric ceramic; and an external electrodes electrically connected to the vibration electrode in the laminated body.

20. A monolithic piezoelectric transducer which comprises a laminated body including a plate-shaped piezoelectric ceramic comprising the piezoelectric ceramic material according to claim 1 and a vibration electrode disposed on the piezoelectric ceramic; and an external electrodes electrically connected to the vibration electrode in the laminated body.

* * * * *